United States Patent [19]

Umezawa et al.

[11] Patent Number: 4,837,429

[45] Date of Patent: Jun. 6, 1989

[54] PHOTODETECTOR FOR USE WITH AN OPTICAL RECORDING MEDIUM

[75] Inventors: Isao Umezawa; Haruo Sone, both of Kanagawa; Tadahiro Kusuda, Kagoshima, all of Japan

[73] Assignee: Sony Corporation, Tokyo, Japan

[21] Appl. No.: 95,237

[22] Filed: Sep. 11, 1987

[30] Foreign Application Priority Data

Oct. 1, 1986 [JP] Japan .................................. 61-233999

[51] Int. Cl.$^4$ ....................... H01L 27/14; H01L 31/00
[52] U.S. Cl. .................................. 250/211 J; 250/201; 357/30
[58] Field of Search ........ 357/30 L; 250/19, 201 DF, 250/211 R, 211 J, 578

[56] References Cited

U.S. PATENT DOCUMENTS 4,488,163 12/1984 Bluzer et al. ........................ 357/30

Primary Examiner—Edward P. Westin
Attorney, Agent, or Firm—Ronald P. Kananen

[57] ABSTRACT

A photodetector includes a center photosensitive section having a surface for receipt of light reflected from an optical recording medium in producing information recorded on the optical recording medium. The center photosensitive section includes a plurality of photosensitive elements separated by a space from one another. A non-reflective transparent film is provided on substantially the whole area of the surface of the center photosensitive section to cover the photosensitive elements and the space.

13 Claims, 4 Drawing Sheets

PHOTODETECTOR FOR USE WITH AN OPTICAL RECORDING MEDIUM

BACKGROUND OF THE INVENTION

This invention relates to a photodetector for use in reproducing information recorded on an optical recording medium.

Upon recording of data from a music or image source on an optical disc recording medium, the data are converted into a digital signal having logic "0" and "1" levels. According to the logic level, pits are formed to provide continuous spiral recording track in the optical disc recording medium. An optical pickup device is used to reproduce the recorded data by radiating a light beam from a light source such as a semiconductor laser through an objective lens which focuses the light beam on the optical disc recording medium and sensing the light beam reflected from the optical recording medium to determine the presence of pits.

According to an astigmatic method, the optical pickup device employs a photodetector placed at a position intermediate between the two astigmatic points of the light beam which has reflected from the optical disc recording medium and passed through a cylindrical lens. The photodetector has a center photosensitive section juxtaposed in a spaced relationship between two side photosensitive sections. The center photosensitive section is divided by a cross-shaped electric and optical insulator into four portions each being formed by a independent photodiode. The shape and position of the reflected light spot formed on the center photosensitive section is dependent upon the distance between the optical disc recording medium and the objective lens. A circular light spot is formed on the center photosensitive section when the objective lens is positioned in focus with respect to the optical disc recording medium. An eliptical light spot is formed on the center photosensitive section when the objective lens is at a shorter or longer distance from the optical disc recording medium. Formation of a light spot on the center photosensitive section causes currents to be derived from the respective divided portions of the center photosensitive section. The derived currents are used to reproduce the recorded data and also to detect an focusing error for a focusing servo control. The side photosensitive sections, each of which is formed by a photodiode, detect respective side beams for a tracking servo control.

One problem occurs in eliminating jitter of the main of RF signal transmitted from such a conventional photodetector in order to improve the reading performance of the optical pickup device. Although attempts have been made to eliminate such jitter by increasing the machining accuracy with which the optical disc recording medium is produced, the results were not satisfactory in some applications.

SUMMARY OF THE INVENTION

Therefore, a main object of the invention is to provide an improved photodetector which is free from the jitter problem.

It is another object of the invention to provide a photodetector having an improved sensitivity particular to low-frequency components of a light spot formed on its center photosensitive section.

There is provided, in accordance with the invention, a photodetector including a center photosensitive section having a surface for receipt of light reflected from an optical recording medium in producing information recorded on the optical recording medium. The center photosensitive section includes a plurality of photosensitive elements separated by a space from one another. A non-reflective transparent film is provided on substantially the whole area of the surface of the center photosensitive section to cover the photosensitive elements and the space.

BRIEF DESCRIPTION OF THE DRAWINGS

The features of this invention which are believed to be novel are set forth with particularity in the appended claims. The invention together with its further objects and advantages thereof, may be best understood, however, by reference to the following description taken in conjunction with the accompanying drawings, in which:

DETAILED DESCRIPTION OF THE INVENTION

Figure 1:
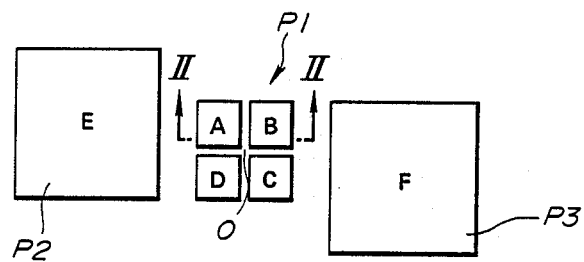
FIG. 1 is a top plan view showing a typical example of photodetector included in an optical pickup device used in reproducing information recorded on an optical disc recording medium.

Referring to FIG. 1, there is illustrated a typical example of photodetector included in an optical pickup device used in reproducing information recorded on an optical recording medium. The photodetector has a center photosensitive section P1 comprised of four photodiodes A, B, C and D separated at slight distance from one another. Two side photosensitive sections P2 and P3 are positioned on the opposite sides of the center photosensitive section P1. The side photosensitive section P2 is comprised of a photodiode E and the side photosensitive section P3 is comprised of a photodiode F.

Figure 2:
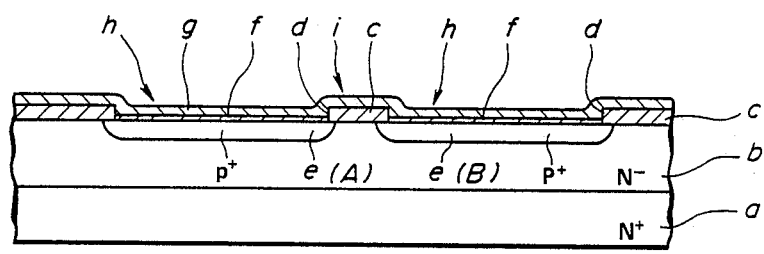
FIG. 2 is a fragmentary sectional view showing the structure of a prior art photodetector.

Prior to the description of the preferred embodiment of the invention, the prior art photodetector of FIG. 2 is briefly described in order to specifically point out the difficulties attendant thereon.

Referring to FIG. 2, the prior art photodetector includes a center photosensitive section P1 which is shown, in section along the lines II—II of FIG. 1, as comprising an N$^-$ silicon semiconductor substrate (a) and an N$^-$ semiconductor layer (b) placed on the surface of the N$^+$ silicon semiconductor substrate (a). An SiO$_2$ field insulation film (c) having a thickness of 7,000

Å is formed on the surface of the N⁻ semiconductor layer (b) to provide electric insulation between the photodiodes A and B. The field insulation film (c) is formed with windows (d) by using an etching technique. These windows (d) are utilized in diffusing a small quantity of P-type impurity to form P+ diffusion regions e(A) and e(B) in the N⁻ semiconductor layer (b). The diffusion region e(A) on the left as viewed in FIG. 2 constitutes a part of the photodiode A and the diffusion region e(B) on the right as viewed in FIG. 2 constitutes a part of the photodiode B. An SiO₂ film (f) having a thickness of 2,000 Å is provided to cover over the whole area of each of the windows (d). A nitride film (g) having a thickness ranging from 3,000 to 4,000 Å is provided to cover the whole area of the surface of the device including the SiO₂ field insulation film (c) and the SiO₂ film (f).

It is to be noted that a nitride film having a thickness ranging from about 3,000 Å to about 4,000 Å is active with an SiO₂ film having a thickness of about 2,000 Å to form a non-reflective transparent film. Therefore, the nitride film (g) acts with the SiO₂ window cover films (f) to form non-reflective transparent films (h) so that the photodiodes A and B can receive the light incident on the non-reflective transparent cover films (h). On the other hand, the nitride film (g) acts with the SiO₂ insulation films (c) having a thickness of 7,000 Å to form reflective cover films (i) so as to provide optical insulation between the photodiodes A and B. As a result, the photodiodes A and B cannot receive the light incident on the reflective cover films (i). Similar electric and optical insulation is provided to separate the photodiode A from the photodiode D, the photodiode B from the photodiode C, and the photodiode C from the photodiode D.

One problem occurs in an attempt to increase the reading performance of the optical pickup device by eliminating jitter of the main of RF signal transmitted from such a prior art center photosensitive section P1. The term "jitter" means a deviation of the actual zero crossing point of the main or RF signal with respect to a predetermined zero cross point. Although it is possible to reduce the jitter to some extent by increasing the machining accuracy with which the optical disc recording medium is produced, this is not satisfactory in some applications. The inventors found that the optical characteristic of the center light receipt section is another factor contributing to the jitter problem. This factor will be described in greater detail with reference to FIGS. 3 and 4.

The light spot formed on the center photosensitive section P1 has low-frequency components concentrated around its center 0 and high-frequency components concentrated near its periphery. The high-frequency components concentrated near the periphery of the light spot contribute to the jitter problem.

Figure 3:
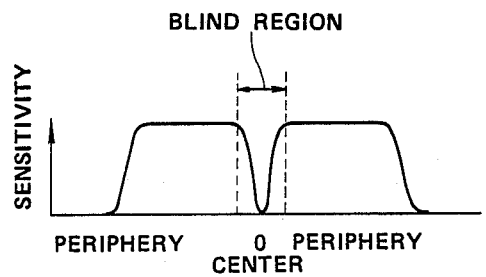
FIG. 3 is a graph showing the sensitivity of the center photosensitive section of the prior art photodetector with respect to a distance from its center.
Figure 4:
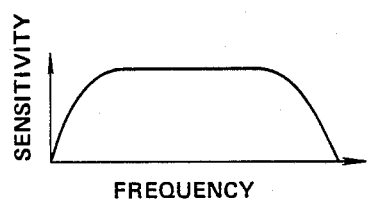
FIG. 4 is a graph of frequency versus sensitivity provided by the center photosensitive section of the prior art photodetector.

As can be seen from FIG. 3 which is a graph showing the sensitivity of the center photosensitive section P1 with respect to a distance from its center 0, the center light receipt section has a relatively large blind region around its center 0 at which the sensitivity is zero. The blind region corresponds to the light spot portion on which low-frequency components are concentrated. For this reason, the center photosensitive section P1 has a low sensitivity for low-frequency components, as can be seen from FIG. 4 which is a graphic illustration of the sensitivity of the center photosensitive section P1 with respect to frequencies. As a result, the RF signal transmitted from the center photosensitive section P1 includes high-frequency components, which contribute to the jitter problem, at a high percentage.

Figure 5:
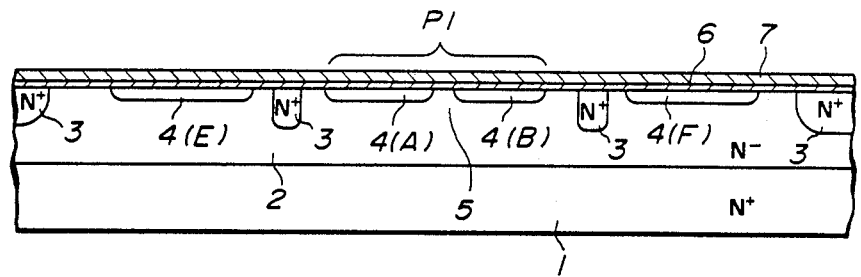
FIG. 5 is a fragmentary sectional view showing the structure of the photodetector of the invention.

Referring to FIG. 5, there is illustrated one embodiment of a photodetector made in accordance with the invention. The photodetector is shown as comprising an N+ silicon semiconductor substrate 1 and an N⁻ semiconductor layer 2 placed on the surface of the N+ silicon semiconductor substrate 1. The photodetector also comprises N+ diffusions 3 formed in the N⁻ semiconductor layer 2 to separate the center photosensitive section P1 from the side photosensitive sections P2 and P3. A small quantity of P-type impurity is diffused to from P+ diffusions 4(A), 4(E) and 4(F) in the N⁻ semiconductor layer 2. The P⁻ diffusion region 4(A) and 4(B) are separated with a gap 5 from each other. The P+ diffusion 4(A) constitutes a part of the photodiode A, the P+ diffusion 4(B) constitutes a part of the photodiode B, the P+ diffusion 4(E) constitutes a part of the photodiode E, and the P+ diffusion 4(F) constitutes a part of the photodiode F. An SiO₂ film 6 is provided on the semiconductor layer 2 to cover the whole area of the surface of the semiconductor layer 2. The SiO₂ film 6 has a thickness of 2,000 Å. A nitride film 7 is provided on the SiO₂ film 6 to over the whole area of the surface of the SiO₂ film 6. The nitride film 7 has a thickness ranging from about 3,000 Å to about 4,000 Å. The nitride film 7 acts with the SiO₂ film 6 to form a non-reflective transparent cover film over the whole area of the surface of the photodetector including the photodiodes A, B, C and D (see FIG. 1) of the center photosensitive section P1 and the photodiodes E and F (see FIG. 1) of the side photosensitive sections P2 and P3.

Referring to FIGS. 6 (A) to 6(E), there is illustrated the sequence of processes for producing the photodetector of the invention.

Figure 6A:
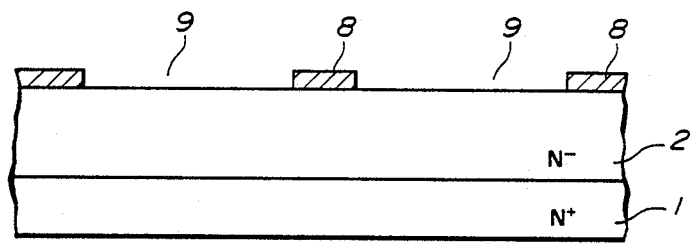
FIGS. 6(A) to 6(E) are fragmentary sections used to explain the sequence of processes for producing the photodetector of the invention.
Figure 6B:
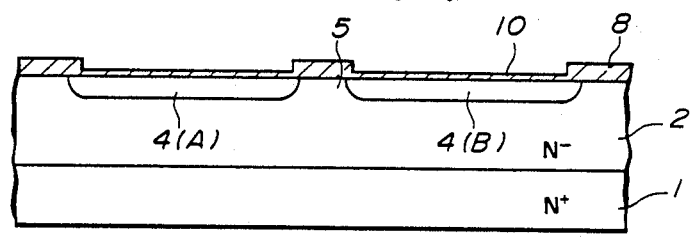
Figure 6C:
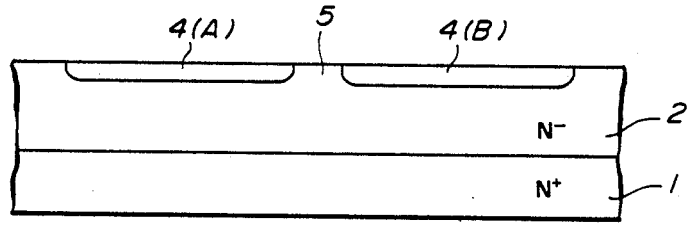
Figure 6D:
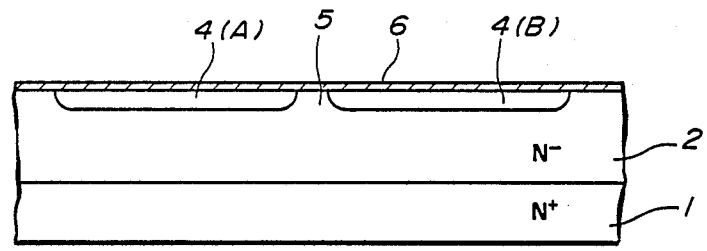
Figure 6E:
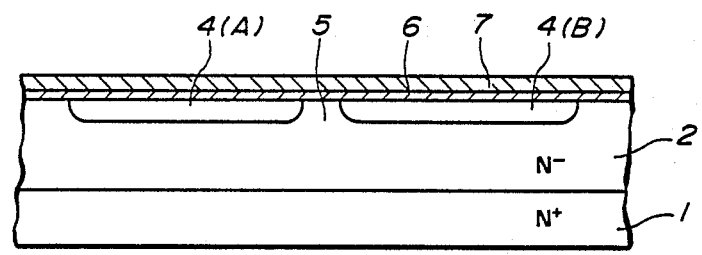

First of all, an N⁻ semiconductor layer 2 is formed on an N+ semiconductor substrate 1. A heating oxidation treatment is applied to form an SiO₂ field insulation film 8 over the whole area of the surface of the N⁻ semiconductor layer 2. This process is followed by application of an etching technique to form windows 9 in the field insulation film 8 at positions corresponding to the photodiodes, as shown in FIG. 6(A). The windows 9 are utilized in diffusing a small quantity of P-type impurity to form P+ diffusions 4(A) and 4(B) in the N⁻ semiconductor layer 2. The windows 9 are covered with SiO₂ films 10, as shown in FIG. 6(B). Following this process, both of the field insulation film 8 and the SiO₂ films 10 are removed from the semiconductor layer 2, as shown in FIG. 6(C). Thereafter, a heating oxidation treatment is applied to form an SiO₂ film 6 having a thickness 2,000 Å on the surface of the semiconductor layer 2, as shown in FIG. 6(D). This process is followed by application of a CVD technique to form a nitride film 7 having a thickness ranging from 3,000 Å to 4,000 Å on the SiO₂ film 6, as shown in FIG. 6(E). It is to be noted that the N+ diffusions 9 may be formed before or after formation of the P+ diffusions 4(A) and 4(B) substantially in the same manner as the diffusions 4 are formed in the N⁻ semiconductor layer 2.

As can be seen from the foregoing, the photodetector includes a center photosensitive section having four photodiodes separated by a space from one another and a non-reflective transparent film provided on the whole area of the surface of the center photosensitive section to cover the photodiodes and the space. Any of the photodiodes can receive the light incident on the non-reflective transparent film at a position just above the space. It is, therefore, apparent that the center photosensitive section has an increased sensitivity around its center.

Figure 7:
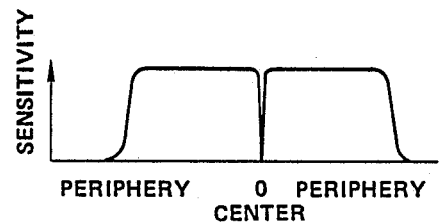
FIG. 7 is a graph showing the sensitivity of the center photosensitive section of the photodetector of the invention with respect to a distance from its center.

FIG. 7 shows the sensitivity of the center photosensitive section P1 with respect to a distance from the center 0 (see FIG. 1) of the center photosensitive section P1. As can be seen from a comparison between FIGS. 3 and 7, the photodetector of the invention includes a center photosensitive section which has a blind region very much smaller than the prior art photodetector.

Figure 8:
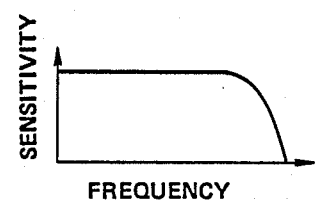
FIG. 8 is a graph of frequency versus sensitivity provided by the center photosensitive section of the photodetector of the invention.

FIG. 8 is a curve of frequency versus sensitivity provided by the photodetector of the invention. As can be seen from a consideration of FIG. 8, there is no sensitive drop for low-frequency components. The result is that the main or RF signal transmitted from the center photosensitive section includes high-frequency components, which contribute to the jitter problem, at a percentage very much smaller than provided with the prior art photodetector.

It has been proven in practice that the jitter standard margin increases to an extent resulting in a 3% or more yield increase upon application of the invention to an optical pickup photodetector.

Although the non-reflective transparent cover film is shown and described as provided on the whole area of the surface of the photodetector, it is to be noted the non-reflective transparent cover film may be provided only on the photosensitive sections P1, P2 and P3.

While this invention has been described in conjunction with a specific embodiment thereof, it is evident that may alternatives, modifications and variations will be apparent to those skilled in the art. For example, the non-reflective transparent cover film is not limited to the double-layer structure of the $SiO_2$ film and the nitride film as long as it is non-reflective and transparent. Accordingly, it is intended to embrace all alternatives, modifications and variations that fall within the scope of the appended claims.

What is claimed is:

1. A photodetector including a center photosensitive section having a surface for receipt of light reflected from an optical recording medium in producing information recorded on the optical recording medium, the center photosensitive section including a plurality of photosensitive elements separated by a space from one another about a center, the center photosensitive section including a non-reflective transparent film provided on substantially the whole area of the surface of the center photosensitive section to cover the photosensitive elements and the space, said film causing said photodetector to exhibit improved sensitivity to low frequency components in said light to reduce jitter in that any of said photosensitive elements is able to receive light incident on the film above said space.

2. The photodetector as claimed in claim 1, wherein the non-reflective transparent film includes an $SiO_2$ film formed on the surface of the center photosensitive section, and a nitride film formed on the $SiO_2$ film.

3. The photodetector as claimed in claim 2, wherein the $SiO_2$ film has a uniform thickness of about 2,000 Å, and wherein the nitride film has a uniform thickness ranging from about 3,000 Å to 4,000 Å.

4. The photodetector as claimed in claim 3, wherein each of the photosensitive elements comprises a photodiode.

5. The photodetector as set forth in claim 1 wherein said center photosensitive section is juxtaposed in a spaced relationship with side photosensitive sections, said non-reflective film being provided on the surface of the center photosensitive section and said side sections.

6. The photodetector as set forth in claim 1 wherein said center photosensitive section includes: a semiconductor substrate; a semiconductor layer placed on a surface of said semiconductor substrate; a plurality of diffusions in said semiconductor layer, said diffusions being of a conductivity type opposite to said semiconductor layer and separated with a gap between a pair of said diffusions so that one diffusion is a part of one photodiode and another diffusion is a part of another photodiode; said film provided on the semiconductor layer to cover the whole area of the surface of the semiconductor layer, including the photodiodes of the center photosensitive section.

7. The photodetector as set forth in claim 6 further including side photodetector sections juxtaposed with said center photodetector section, said film covering the whole area of the photodiodes of the side photodetector sections, and diffusions formed in the semiconductor layer to separate the center photosensitive section from the side photosensitive sections.

8. A photodetector for use in reproducing information recorded on an optical recording medium, comprising:
a center photosensitive section having a surface for receiving light reflected from said optical recording medium and outputting a signal representative thereof, and including a plurality of photosensitive elements separated by a space from one another about a center; and
means for improving the sensitivity of the center photosensitive section with respect to a distance from the center of the center photosensitive section to provide a relatively narrow blind region where sensitivity of the photosensitive section to low frequency light components is reduced, said sensitivity improving means comprising a non-reflective transparent film provided on substantially the entire area of the surface of the center photosensitive section to cover the photosensitive elements and the space between the photosensitive elements, whereby any of the photosensitive elements can receive light incident on the film above the space to improve sensitivity of the photodetector about its center.

9. The photodetector as set forth in claim 8 wherein said sensitivity improving means improves the sensitivity of said photodetector elements to low frequency components about its center thus reducing a percentage of high frequency light components in light received from said optical recording medium.

10. The photodetector as set forth in claim 9 wherein said center photosensitive section is juxtaposed in a spaced relationship between side photosensitive sections, said non-reflective transparent cover film being provided on said center section and said side section.

11. The photodetector as set forth in claim 9 wherein the non-reflective transparent film includes an $SiO_2$ film formed on the surface of the center photosensitive section, and a nitride film formed on the $SiO_2$ film.

12. The photodetector as set forth in claim wherein the non-reflective transparent film includes and $SiO_2$ film formed on the surface of the center photosensitive section, and a nitride film formed on the $SiO_2$ film.

13. The photodetector as set forth in claim 8 wherein said center photosensitive section includes: a semiconductor substrate; a semiconductor layer placed on a surface of said semiconductor substrate; a plurality of diffusions in said semiconductor layer, said diffusions being of a conductivity type opposite to said semiconductor layer and separated with a gap between a pair of said diffusions so that one diffusion is a part of one photodiode and another diffusion is a part of another photodiode; said film provided on the semiconductor layer to cover the whole area of the surface of the semiconductor layer, including the photodiodes of the center photosensitive section.

* * * * *